US006545877B1

(12) United States Patent
Agha et al.

(10) Patent No.: US 6,545,877 B1
(45) Date of Patent: Apr. 8, 2003

(54) CARD RETAINING MODULE FOR EXPANSION SLOTS

(75) Inventors: Bilal I. Agha, Georgetown, TX (US); Steven L. Sands, Austin, TX (US)

(73) Assignee: Dell U.S.A., L.P., Round Rock, TX (US)

( * ) Notice: Subject to any disclaimer, the term of this patent is extended or adjusted under 35 U.S.C. 154(b) by 0 days.

(21) Appl. No.: 09/179,327

(22) Filed: Oct. 27, 1998

(51) Int. Cl.[7] .............................. H05K 7/14; H05K 7/18
(52) U.S. Cl. ...................... 361/801; 361/759; 361/802
(58) Field of Search ................................. 361/740, 741, 361/736, 737, 759, 801, 807, 810, 800, 802; 439/360, 325–328

(56) References Cited

U.S. PATENT DOCUMENTS

| | | | | |
|---|---|---|---|---|
| 3,662,224 A | * | 5/1972 | Rauch ......................... | 361/802 |
| 4,307,510 A | | 12/1981 | Sawyer et al. ................ | 29/764 |
| 4,803,473 A | * | 2/1989 | Taylor ......................... | 340/693 |
| 4,821,145 A | * | 4/1989 | Corfits et al. ................ | 361/684 |
| 4,858,070 A | * | 8/1989 | Buron et al. ................ | 361/384 |
| 5,099,391 A | * | 3/1992 | Maggelet et al. ............ | 361/395 |
| 5,218,518 A | * | 6/1993 | Deinhardt et al. .......... | 361/395 |
| 5,388,030 A | * | 2/1995 | Gasser et al. ................ | 361/818 |
| 5,446,622 A | | 8/1995 | Landry et al. ............... | 361/737 |
| 5,637,004 A | * | 6/1997 | Chen et al. .................. | 439/157 |
| 5,644,470 A | | 7/1997 | Benedict et al. ............. | 361/686 |
| 5,966,289 A | * | 10/1999 | Hastings et al. ............. | 361/704 |
| 6,056,579 A | * | 5/2000 | Richard, III et al. ........ | 439/358 |
| 6,208,527 B1 | * | 3/2001 | McMahon et al. ........... | 361/801 |

* cited by examiner

Primary Examiner—David L. Talbott
Assistant Examiner—Tuan Dinh
(74) Attorney, Agent, or Firm—Haynes and Boone, LLP

(57) ABSTRACT

A system and method for use in a computer system that includes a circuit board having a slot, a system processor, a card having tabs positionable in the slot, a computer bus operably connected between the system processor and the slot, a retaining module including a handle portion and a supporting frame, and a wall portion substantially covering one side of the supporting frame. The supporting frame is sized to support the card during insertion and removal of the tabs in the slot. The supporting frame includes an edge that may be used as the handle portion. The retaining module may also include a mounting platform for the card. Fastening structure may be positioned on the mounting platform, on the supporting frame, or on the edge of the supporting frame. Various types of fastening structure may be utilized including a peg that engages a hole in the card and a flexible clip that retains the card in the retaining module.

14 Claims, 3 Drawing Sheets

CARD RETAINING MODULE FOR EXPANSION SLOTS

BACKGROUND OF THE INVENTION

1. Field of the Invention

This invention relates to the field of installing and removing devices in a computer, and more particularly, to a method and apparatus for installing, retaining, and removing plug-in cards in computer circuit board expansion slots.

2. Description of the Related Art

Typical computer systems include a motherboard for mounting at least one microprocessor and other application specific integrated circuits (ASICs), such as memory controllers, input/output (I/O) controllers, and the like. Most motherboards include slots for additional adapter cards to provide additional function to the computer system. Typical functions that a user might add to a computer include additional microprocessors, additional memory, fax/modem capability, sound cards, graphics cards, or the like. The slots included on the motherboard generally include in-line electrical connectors having electrically conductive lands which receive exposed tabs on the adapter cards. The lands are connected to wiring layers, which in turn are connected to a bus that allows the cards to communicate with the microprocessor or other components in the system. Computer systems use many different types of buses to link the various components such as a "local bus" which connects one or more microprocessors to the main memory, the Industry Standard Architecture (ISA) bus for sound cards and modems, the Peripheral Component Interconnect (PCI) bus for graphics cards, SCSI adapters, and sound cards, the Universal Serial Bus (USB) for pointing devices, scanners, and digital cameras, and Fire Wire (IEEE-1394) for digital video cameras and high-speed storage drives.

Problems with the system may occur when a particular slot on a motherboard is unoccupied. When the system tries to establish I/O with the non-existent card via a bus, system operation may slow down or stop completely while the system waits for a response. To prevent this from occurring, the slot may be occupied by a terminator card which responds to queries from the system and prevents the problems that may occur when a slot is left vacant. It is often difficult to install and remove such cards and several devices currently exist to facilitate insertion and removal of the cards.

An important aspect in computer system design is providing adequate cooling for microprocessors to prevent performance degradation that may occur when the temperature of the components rises above a certain level. Computer systems are currently available wherein a microprocessor is mounted in a cartridge that includes heatsink fins to disperse heat from the microprocessor as air flow from cooling fans passes by the fins. The cartridge plugs into a slot on the motherboard similar to adapter and terminator cards. This device is known as the Single Edge Contact (SEC) cartridge. When a microprocessor is mounted in a structure, such as a SEC cartridge, adjacent to an expansion slot containing a terminator card, it is desirable for air flow to continue to be directed past the heatsinks.

Another important aspect in computer system design is ease of installing and removing cards in expansion slots. Oftentimes, the cards do not include any surrounding structure and it is very difficult to grasp the cards during removal and installation. Further, the cards may be damaged as force is exerted using fingers or other devices positioned on the card and/or its components. Several devices in the prior art address this concern. For example, U.S. Pat. No. 4,307,510 pertains to a cylindrical bar adapted to rest on rail surfaces of a card rack that provides a fulcrum for prying a card from a slot by engaging the blade of a screw driver. U.S. Pat. No. 5,446,622 pertains to a PC board cartridge for holding a PC board with a connector within. The cartridge includes a pivotally mounted handle that applies equal forces across the connector during removal. U.S. Pat. No. 5,644,470 teaches a computer system which allows a user to remove or install cards without removing the computer's cover.

None of the known devices provide a device which simultaneously addresses the concerns of directing airflow past heatsink structures, facilitating insertion and removal of the card, and supporting terminator and adapter cards in the slots.

SUMMARY OF THE INVENTION

The present invention is used in a computer system that includes a circuit board having a slot, a system processor, a card having tabs positionable in the slot, a computer bus operably connected between the system processor and the slot, a retaining module including a handle portion and a supporting frame, and a wall portion substantially covering one side of the supporting frame. The supporting frame is sized to support the card during insertion and removal of the tabs in the slot. The supporting frame includes an edge that may be used as the handle portion. The retaining module may also include a mounting platform for the card. Fastening structure may be positioned on the mounting platform, on the supporting frame, or on the edge of the supporting frame. Various types of fastening structure may be utilized to hold the card in the retaining module including a peg that engages a hole in the card and a flexible clip that holds the card in place in the retaining module.

To install the card in the retaining module using one embodiment of a fastening structure, the card is first positioned over the mounting platform to align any holes in the card with the corresponding pegs. As the card is slid down the peg, the edge of the card moves along a tapered portion of the flexible clip, thereby bending or flexing the flexible clip away from the edge of the card. When the edge of the card slides past a stepped portion of the flexible clip, the flexible clip returns substantially back to its former position, thereby overlying the edge of the card and retaining it in the module.

To install the retaining module/card combination in the slot, the user grasps the handle portion and inserts the tabs on the card into the slot using the retaining module as a guide. A computer system may include a cartridge overlying the slot, and the retaining module is sized and shaped to fit within the cartridge to guide the card as it is being inserted and to stabilize the card in the slot once it is installed. The handle portion may also be used to remove the retaining module from the cartridge by grasping the handle portion and applying force in a direction to remove the retaining module from the cartridge.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
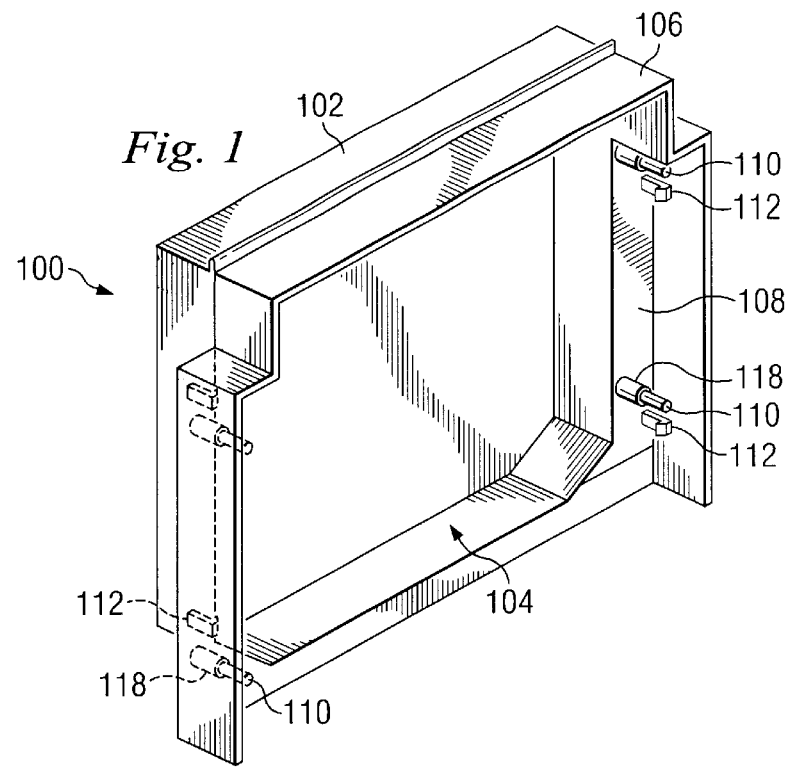
FIG. 1 is a perspective view of a retention module.

Referring to FIG. 1, a perspective view of retaining module 100 for retaining a card such as an expansion card, an adapter card, or a terminator card, in a computer system is shown. Retaining module 100 includes support frame 102, shown in FIG. 1 having a four-sided, rectangular shape. However, support frame 102 may be sized and shaped as required to accommodate a variety of card shapes and sizes. Wall portion 104 substantially covers one side of support frame 102 to prevent air flow from passing through retaining module 100 as explained hereinbelow. Edge 106 extends around and overhangs at least a portion of the perimeter of support frame 102. Edge 106 stabilizes retaining module 100 when it is inserted in a cartridge in a computer system. Edge 106 may also be used as a handle to facilitate inserting and removing retaining module 100. These features are further described hereinbelow.

Retaining module 100 includes one or more mounting platforms 108 as required to aid in supporting a card and to provide clearance between components and/or wiring on a card and retaining module 100. It is recognized that various shapes and sizes of mounting platform 108 are suitable for use with the present retaining module 100. Mounting platform 108 may also be located at various positions relative to support frame 102. Further, mounting platform 108 may be constructed independently of other portions of retaining module 100 and attached to any portion of retaining module 100 using any suitable attachment method such as a bonding process. Alternatively, mounting platform 108 may be formed integrally with support frame 102 and/or other portions of retaining module 100.

Figure 1B:
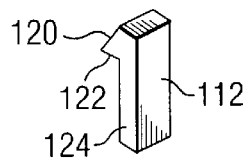
FIG. 1B is a perspective view of a fastener.
Figure 1A:
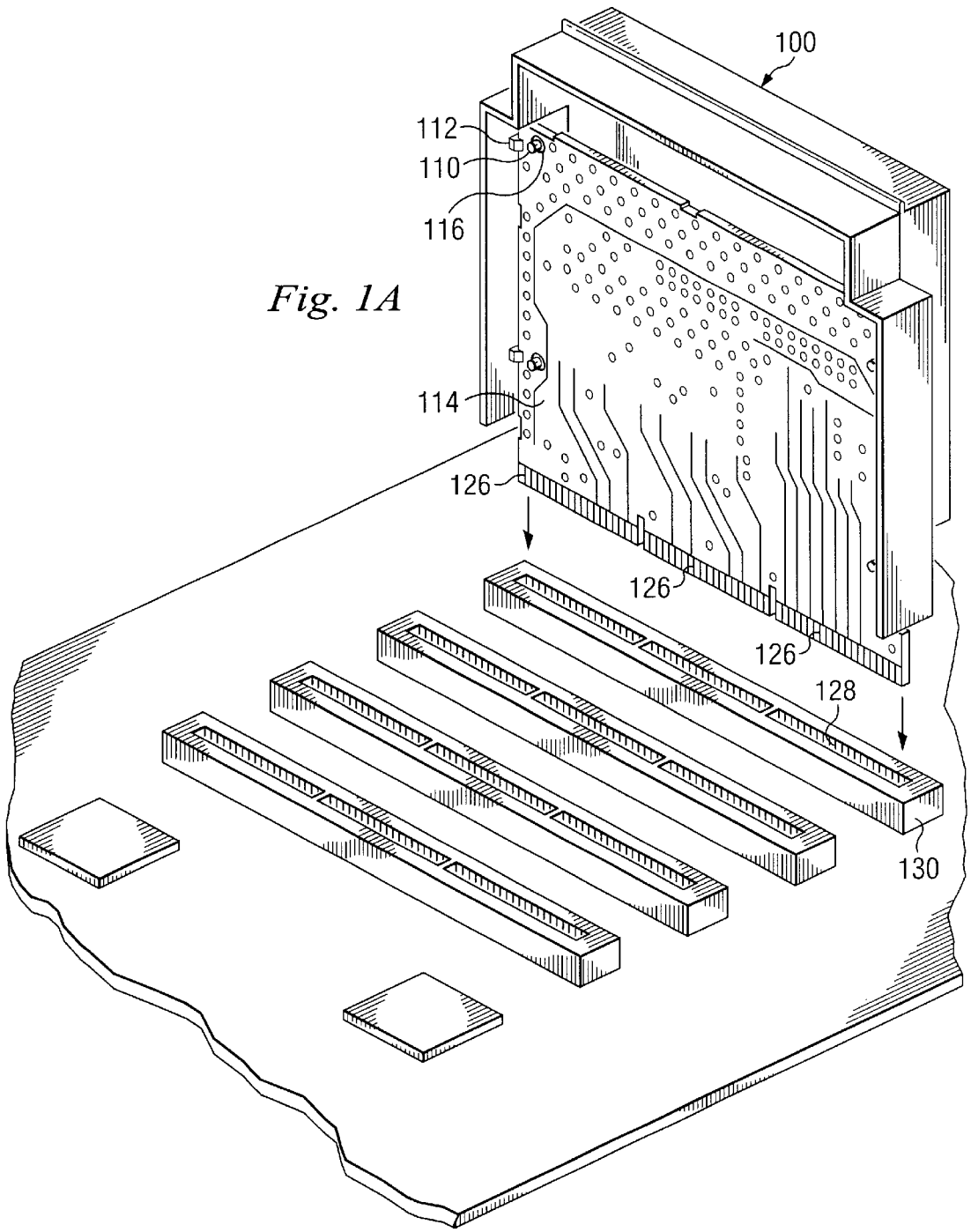
FIG. 1A is an exploded perspective view of the retention module and a card for positioning in the retention module.

Various fastening structures may also be positioned on mounting platform FIGS. 1 and 1A show U-shaped mounting platform 108 extending around three sides of the outer portion of support frame 102. One or more side portions of mounting platform 108 include fastening structure, shown in FIGS. 1 and 1a as one or more pegs 110 and flexible clips 112 for supporting and retaining card 114 on mounting platform 108. Peg 110 engages a corresponding opening or hole 116 in card 114. Card 114 is supported by base portion 118, which has a cross-sectional area that is larger than the cross-sectional area of hole 116 in card 114. Base portion 118 prevents further movement of card 114 toward mounting platform 108, thereby preventing damage to any components or wiring that may be located near the edge of card 114. It is also recognized that card 114 may not have any components or wiring near its outer edge. In this situation, base portion 118 is not required and the edges of card 114 may rest directly on mounting platform 108. Peg 110 may be formed independently of base portion 118 and attached to base portion 118 using any suitable attachment means. Alternatively, peg 110 may be formed integrally with base portion 114 through various known manufacturing processes such as injection molding. Fastening structure may also be included on other portions of retaining module 100 instead of or in addition to fastening structure on mounting platform 108.

Flexible clip 112, shown in more detail in FIG. 1B, includes tapered portion 120 adjacent stepped portion 122. Flexible clip 112 is located on mounting platform 108 so that the outer edge of card 114 slides along tapered portion 120 as card 114 moves along peg 110. Stem portion 124 of flexible clip 112 is constructed of resilient material that flexes when lateral force is applied to tapered portion 120. Stem portion 124 returns substantially to its former configuration when the force is released. To remove a card 114 from retaining module 100, lateral force is applied to tapered portion 120 to move stepped portion 122 away from the edge of card 114. Stem portion 120 returns substantially to its unflexed position when force is released. It should be noted that various fastening structures known in the art are suitable for use in addition to or instead of peg 110 and flexible clip 112. Frictional forces may be used as another alternative instead of or in addition to other fastening structures for retaining card 114. For example, edge 106 or support frame 102 may be sized and constructed of suitable material to engage edges of card 114 and retain card 114 through frictional force.

Figure 2:
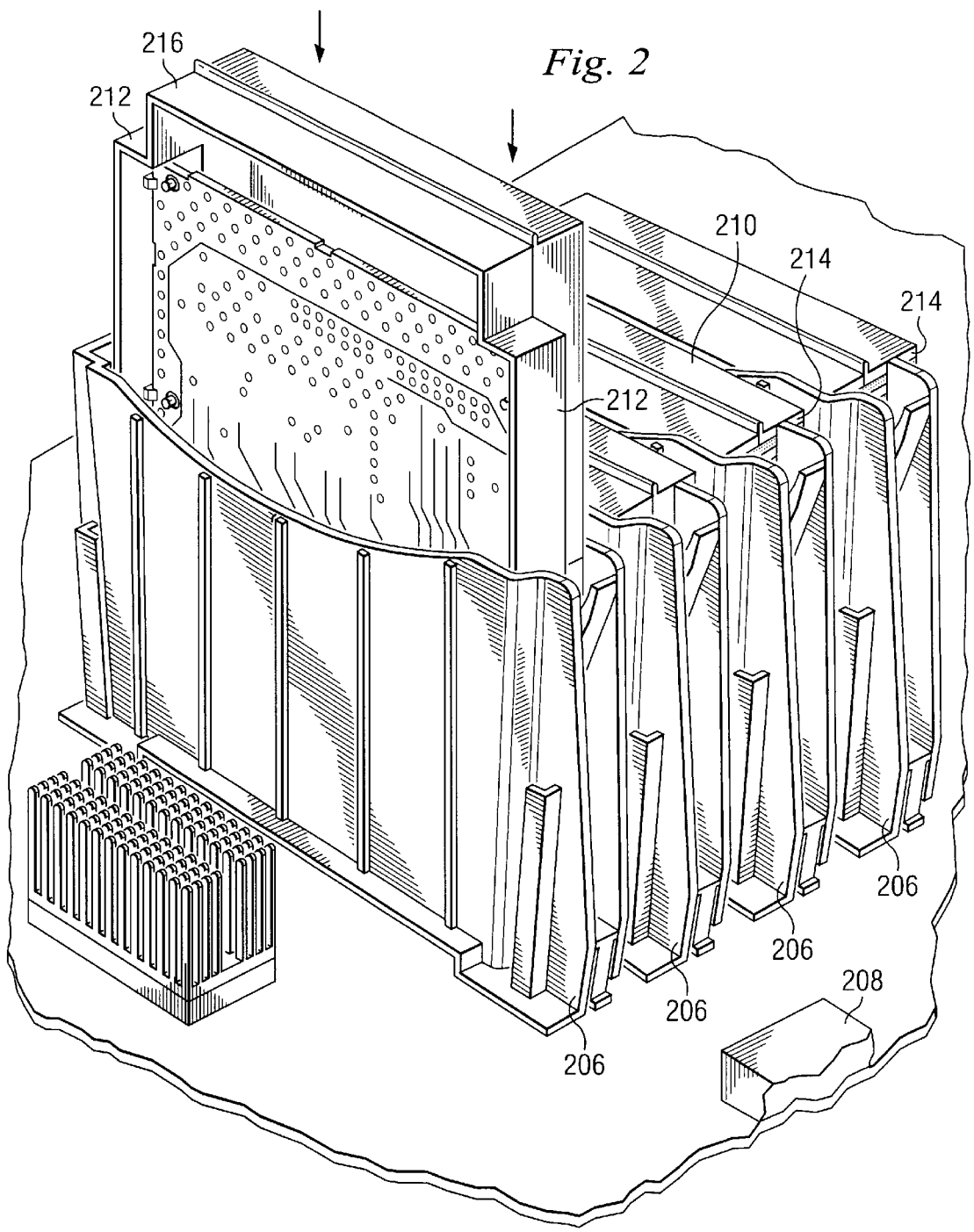
FIG. 2 is a perspective view of the card retention module being inserted in a cartridge on a motherboard.

Card 114 includes tabs 126 that carry electrical signals to and from components on card 114 from electrical lands in a slot 130. The particular embodiment of retaining module 100 shown in FIGS. 1 and 1A is useful for inserting card 114 in cartridge 206 as shown in FIG. 2. Each cartridge 206 overlays an expansion.slot (not shown) in motherboard 208. Motherboard 208 is the main circuit board inside a computer system which holds one or more processing units, memory, and expansion slots and connects directly or indirectly to every part of the computer system. Each cartridge 206 is also capable of receiving one of various devices including combination microprocessor/heatsink structures 210 and retaining module/card structures 212. The devices have exposed tabs 126 that mate with the expansion slot 130 (FIG. 1A). Thus, it is important in the present invention for tabs 126 to be exposed and for the structure of retaining module 100 not to interfere with inserting tabs 126 in the expansion slot 130.

Figure 3:
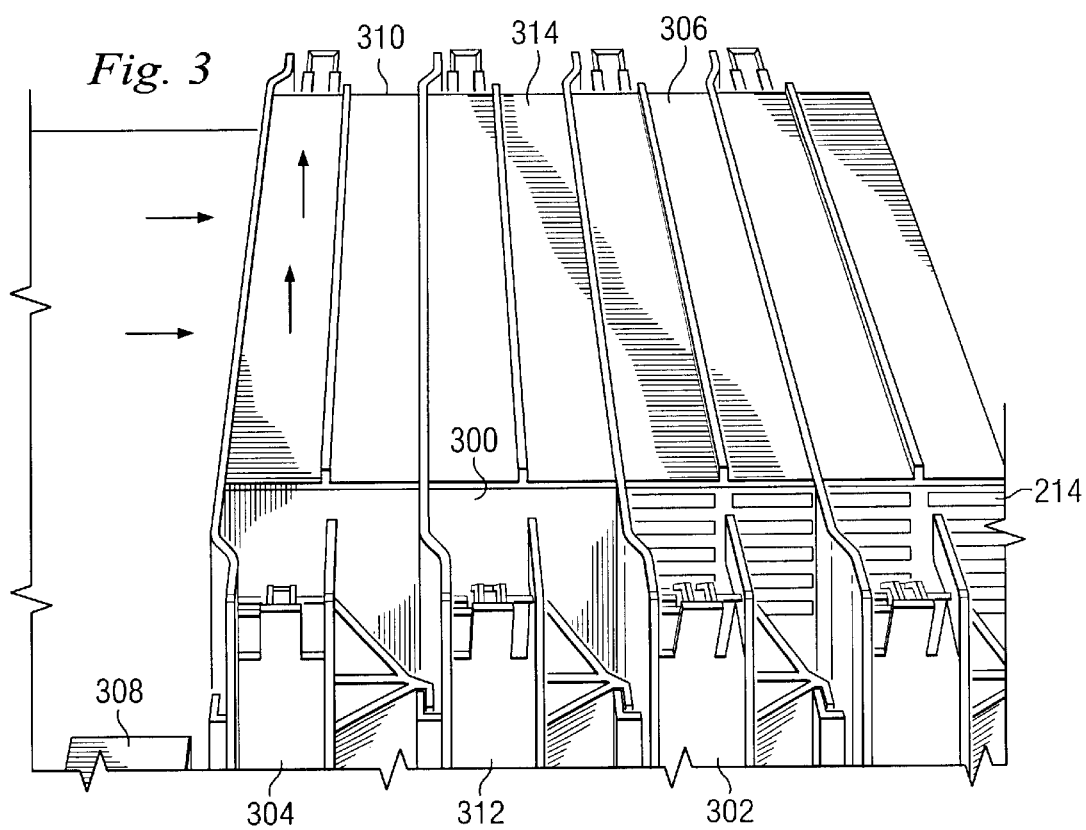
FIG. 3 is a perspective view showing use of a portion of the card retention module for removing the card retention module from a cartridge on a motherboard.

Devices known as Single Edge Contact (SEC) cartridges 206 shown in FIGS. 2 and 3 are used in computer systems, such as those currently available from Intel Corporation, Santa Clara, Calif., having the Deschutes microprocessors and Slot 1 or Slot 2 interfaces. The Slot 1 interface accommodates two central processing units (CPUs), namely, 333-MHz Pentium II microprocessors that run at 66 MHz bus clock. The Slot 2 interface accommodates up to four CPUs, namely 350–450 MHz Pentium II microprocessors that run using a 100 MHz system bus. FIGS. 2 and 3 show a Slot 2 interface having four SEC cartridges 206. The Deschutes microprocessors are mounted in cartridge 206 using combination heatsink/microprocessor structure 210 that includes fins 214 to disperse heat from the microprocessor as air flow from cooling fans (not shown) passes by fins 214.

When a heatsink/microprocessor structure 210 is not installed in one or more of the expansion slots, a terminator card, such as card 114 (FIG. 1), is inserted in the expansion slot to alleviate problems that may occur when an expansion slot is left vacant. In the Slot 1 and Slot 2 interface systems, the terminator cards are fairly large and require supporting structure to stabilize and retain them in SEC cartridge 206. This support is provided in the embodiment of retaining module 100 shown in FIG. 1 by support frame 102 and edge 106. As shown in FIG. 2, the combination retaining module/card structures 212 are sized to slip into and out of SEC cartridge 206, and yet fit snugly enough within SEC cartridge 206 to reduce or even prevent movement of card 114 in the expansion slot. In this embodiment, retaining module

100 also facilitates proper installation of card 114 as it serves as a guide through cartridge 206.

When a terminator card is positioned in a vacant expansion slot, it is desirable for air flow to be directed past heatsink fins 214. In the embodiment of retaining module 100 shown in FIGS. 1 through 2, wall portion 104 and edge 106 are designed to force air flow from cooling fans (not shown) past fins 214 of heatsink/microprocessor structure 210 by blocking air flow through retaining module 100. This is useful in situations where card 114, such as a terminator card, does not include many active components and therefore requires little or no air flow for cooling. In situations where card 114 does require cooling, wall portion 104 may cover only a portion of one side of support frame 102, or wall portion 104 may not be required. Additionally, depending on cooling requirements, the length and/or width of edge 106 may be reduced along one or more sides to allow air flow past card 114.

An important feature of the present retaining module 100 is edge 106 on the upper periphery of support frame 102. This portion of edge 106 functions as a handle to facilitate inserting and removing card 114 from a cartridge, such as SEC cartridge 206. The dimensions and shape of retaining module 100 allow clearance between card 114 and the upper portion of edge 106 when card 114 is positioned in retaining module 100. As shown in FIG. 2, this clearance creates a cavity that allows fingers or other suitable device to be used as a handle 216 for grasping edge 106 and support frame 102. Handle 216 facilitates installing and removing retaining module 100.

In FIG. 3, when retaining module 300 is inserted intermediate cartridges 302 and 304 that are occupied by other devices such as heatsink/microprocessor structure 306 and retaining module 308, it may be difficult to access handle 216 (FIG. 2) in retaining module 300. In this situation, one option is to remove the device, shown in FIG. 3 as retaining module 308, occupying cartridge 304 adjacent intermediate retaining module 300 to gain access to handle 216. Alternatively, edge 106 may be modified or additional structure may be added so that retaining module 308 does not have to be removed first. One,alternative is to reduce the width of edge 106 on the upper periphery over a short length to allow access to handle 216 using a small implement. Another alternative is to grasp intermediate retaining module 300 along the sides of support frame 314 to remove intermediate retaining module 300 from cartridge 312 at least enough to gain access to handle 216. Note that fingertip size indentations or raised ridges may be added near the upper portion of the sides of support frame 314 to improve the user's grasp. It is recognized that the foregoing examples are just a few of the variety of alternatives that are possible to help remove retaining module 300 from cartridge 312 and the foregoing examples are not intended to limit the present invention to specific configurations.

The present retaining module 100 is constructed on non-conductive materials such as plastic or rubber. Various manufacturing processes may be used to fabricate the components individually and attach them together in the desired configuration, or to form the components in integral units.

Advantageously, the present invention provides retaining module 100 that protects the card as it is installed and removed. The handle 216 provides structure for a user to grasp instead of potentially damaging the card or its components by putting fingers or other tools directly on the card itself. The handle 216 also allows the user to gain a firmer grasp and to apply force evenly when installing and removing the card. The present invention is thus expected to improve reliability and the useful life of adapter and terminator cards. When a card, such as a terminator card, requires little or no cooling, the present invention contributes to system reliability by forcing air flow from cooling fans toward cartridges containing microprocessor and heatsink structures instead of allowing the air flow to pass by the terminator card.

Other embodiments of retaining module 100 can be sized and shaped for use in computer systems in addition to computer systems with Slot 1 and Slot 2 interfaces. While the invention has been described with respect to the embodiments and variations set forth above, these embodiments and variations are illustrative and the invention is not to be considered limited in scope to these embodiments and variations. Accordingly, various other embodiments and modifications and improvements not described herein may be within the spirit and scope of the present invention, as defined by the following claims.

What is claimed is:

1. A computer system comprising:
    a circuit board including a slot;
    a card having tabs positionable in the slot;
    a retaining module including a handle portion and a supporting frame, wherein the handle portion is clear of the card and the supporting frame is sized to support the card during insertion and removal of the tabs in the slot;
    a wall portion substantially covering one side of the supporting frame to block air flow past the card;
    means for retaining the card in the supporting frame, the means for retaining including a plurality of pegs and flexible clips extending from a mounting platform, each peg having an enlarged base for supporting the card in a raised position above the mounting platform, and each clip being adjacent a respective peg for retaining the card on the enlarged base; and
    a cartridge attached to the circuit board for receiving the retaining module.

2. The computer system, as set forth in claim 1, wherein the handle portion is formed by an edge portion of the supporting frame.

3. The computer system, as set forth in claim 1, wherein the means for retaining the card in the supporting frame includes edge portions around the supporting frame to engage the edges of the card and retain the card through frictional forces.

4. An apparatus for installing and removing a card in a circuit board, the circuit board including a slot, the card having a tab positionable in the slot, the apparatus comprising:
    a retaining module including a handle portion and a supporting frame, wherein the handle portion is clear of the card and the supporting frame is sized to support the card during insertion and removal of the tab in the slot;
    a wall portion substantially covering one side of the supporting frame to block air flow past the card; and
    means for retaining the card in the supporting frame, the means for retaining including a plurality of pegs and flexible clips extending from a mounting platform, each peg having an enlarged base for supporting the card in a raised position above the mounting platform, and each clip being adjacent a respective peg for retaining the card on the enlarged base.

5. The apparatus, as set forth in claim 4, wherein the handle portion is formed by an edge portion of the supporting frame.

6. The apparatus, as set forth in claim 4, wherein the means for retaining the card in the supporting frame includes edge portions around the supporting frame to engage the edges of the card and retain the card through frictional forces.

7. An apparatus for retaining a printed circuit card on a circuit board, the apparatus comprising:

a cartridge having an opening at one end and being attached to the circuit board at another end;

a support frame sized to fit in the opening of the cartridge, wherein the support frame includes a wall portion substantially covering at least one side of the support frame to block air flow past the card;

a handle formed in an edge portion of the support frame clear of the card; and means for retaining the card in the support frame, the means for retaining including a plurality of pegs and flexible clips extending from a mounting platform, each peg having an enlarged base for supporting the card in a raised position above the mounting platform, and each clip being adjacent a respective peg for retaining the card on the enlarged base.

8. The apparatus, as set forth in claim 7, wherein the edge portion is exposed by the opening in the cartridge to allow access to the handle.

9. The apparatus, as set forth in claim 7, wherein the means for retaining the card in the support frame includes edge portions around the supporting frame to engage the edges of the card and retain the card through frictional forces.

10. A method for installing a card in a slot in a circuit board, the method comprising:

providing a retaining module, wherein the retaining module includes a support frame, a wall portion substantially covering one side of the support frame to block air flow past the card, an edge overhanging at least a portion of the perimeter of the support frame forming a handle clear of the card, a mounting platform proximate the support frame, and a plurality of pegs and flexible clips extending from the mounting platform;

providing an enlarged base on each peg;

mounting the card on the mounting platform;

retaining the card on each base in a raised position above the mounting platform by a respective clip engaging the card on the base of each peg; and utilizing the handle to install the card in a cartridge, wherein the cartridge surrounds the slot, and is attached to the circuit board.

11. The method, as set forth in claim 10, wherein the support frame is substantially rectangular and the edge extends around three sides of the perimeter of the support frame.

12. The method, as set forth in claim 10, wherein the means for retaining the card in the support frame includes edge portions around the support frame to engage the edges of the card and retain the card through frictional forces.

13. A computer system comprising:

a circuit board comprising a slot;

a card comprising an end portion which is positioned in the slot;

a retaining module comprising a handle coupled to a card supporting frame, wherein the frame comprises a planar surface which engages the card;

a mounting platform in the module;

at least three pegs and flexible clips extending from the mounting platform, each peg having an enlarged base for supporting the card in a raised position above the mounting platform, and each clip being adjacent a respective peg for retaining the card on the enlarged base; and a cartridge attached to the circuit board for receiving the retaining module.

14. The computer system of claim 13 wherein the frame further comprises:

a first wall fixedly connected to and extending from an edge of the planar surface at a non-zero angle; and a second wall fixedly connected to and extending from an edge of the first wall at a non-zero angle such that the second wall is parallel to the planar surface.

\* \* \* \* \*